(12) United States Patent
Taniguchi et al.

(10) Patent No.: US 7,737,806 B2
(45) Date of Patent: Jun. 15, 2010

(54) PIEZOELECTRIC THIN-FILM RESONATOR AND FILTER

(75) Inventors: Shinji Taniguchi, Kawasaki (JP); Tokihiro Nishihara, Kawasaki (JP); Tsuyoshi Yokoyama, Kawasaki (JP); Masafumi Iwaki, Kawasaki (JP); Motoaki Hara, Kawasaki (JP); Go Endo, Yokohama (JP); Yasuyuki Saitou, Yokohama (JP); Masanori Ueda, Kawasaki (JP)

(73) Assignees: Fujitsu Media Devices Limited, Yokohama (JP); Fujitsu Limited, Kawasaki (JP)

(\*) Notice: Subject to any disclaimer, the term of this patent is extended or adjusted under 35 U.S.C. 154(b) by 98 days.

(21) Appl. No.: 12/122,246

(22) Filed: May 16, 2008

(65) Prior Publication Data
US 2008/0284543 A1 Nov. 20, 2008

(30) Foreign Application Priority Data
May 17, 2007 (JP) ............................. 2007-131094

(51) Int. Cl.
*H03H 9/00* (2006.01)
*H01L 41/04* (2006.01)

(52) U.S. Cl. ......................... 333/187; 333/192; 310/320

(58) Field of Classification Search ................. 333/187, 333/188, 189, 190, 191, 192; 310/320
See application file for complete search history.

(56) References Cited

U.S. PATENT DOCUMENTS

| 6,507,983 | B1 * | 1/2003 | Ruby et al. | 29/25.35 |
| 6,992,420 | B2 * | 1/2006 | Jang et al. | 310/324 |
| 7,187,253 | B2 * | 3/2007 | Sano et al. | 333/187 |
| 7,199,683 | B2 * | 4/2007 | Thalhammer et al. | 333/187 |
| 7,342,351 | B2 * | 3/2008 | Kubo et al. | 310/344 |
| 2006/0091764 | A1 * | 5/2006 | Tsutsumi et al. | 310/324 |
| 2007/0096597 | A1 | 5/2007 | Taniguchi et al. | |

FOREIGN PATENT DOCUMENTS

| JP | 60-189307 A | 9/1985 |
| JP | 2002-140075 A | 5/2002 |
| JP | 2005-536908 A | 12/2005 |
| JP | 2006-254295 A | 9/2006 |
| KR | 1020070045945 A | 5/2007 |

OTHER PUBLICATIONS

Takeuchi et al., Stress Adjustment and Characteristics Improvement in a 1.8GHz Range Film Bulk Acoustic Wave Resonator by Using Multi-layer Structure of ZnO/Al2O3/SiO2, Fall 2002, Materials Research Society,Symposium J vol. 741 Paper J5.9, 7 pages.*

(Continued)

*Primary Examiner*—Dean O Takaoka
(74) *Attorney, Agent, or Firm*—Arent Fox LLP

(57) ABSTRACT

A piezoelectric thin-film resonator includes: a lower electrode that is formed on a substrate; a piezoelectric film that is formed on the substrate and the lower electrode; an upper electrode that is formed on the piezoelectric film, with a portion of the piezoelectric film being interposed between the lower electrode and the upper electrode facing each other; and an additional film that is formed on the substrate on at least a part of the outer periphery of the lower electrode at the portion at which the lower electrode and the upper electrode face each other, with the additional film being laid along the lower electrode.

13 Claims, 13 Drawing Sheets

OTHER PUBLICATIONS

Lee et al., Relationship between residual stress and structural properties of AlN films deposited by R.F. reactive sputtering, Jul. 2003, Elsevier Science B.V., vol. 435, 6 pages.*

K. Nakamura, et al., "ZnO/SiO2-Diaphragm Composite Resonator on a Silicon Wafer", Electronics Letters, Jul. 9, 1981, vol. 17, No. 14, pp. 507-509.

* cited by examiner

REFLECTION
CHARACTERISTICS
IMPROVED

PIEZOELECTRIC THIN-FILM RESONATOR AND FILTER

BACKGROUND OF THE INVENTION

1. Field of the Invention

The present invention generally relates to a piezoelectric thin-film resonator and a filter, and more particularly, to a piezoelectric thin-film resonator that utilizes the conversions between electric signals and bulk acoustic waves caused in a piezoelectric thin film, and a filter that includes such piezoelectric thin-film resonators.

2. Description of the Related Art

As wireless devices such as portable telephone devices have spread rapidly, there is an increasing demand for small, light-weight resonators, and filters formed by combining those resonators. Conventionally, dielectric filters and surface acoustic wave (SAW) filters have been used. In recent years, however, attention is drawn to piezoelectric thin-film resonators that exhibit excellent characteristics especially at high frequencies and can be made small or monolithic in size, and also to filters that are formed with those piezoelectric thin-film resonators.

Piezoelectric thin-film resonators are classified into FBAR (Film Bulk Acoustic Resonator) types and SMR (Solidly Mounted Resonator) types. A FBAR-type piezoelectric thin-film resonator has a film stack structure that consists of a lower electrode, a piezoelectric film, and an upper electrode, and is formed on a substrate. A hollow space or cavity is formed below the lower electrode at a location (a resonant portion) at which the lower electrode and the upper electrode face each other, with the piezoelectric film being interposed between the lower electrode and the upper electrode. The cavity in an FBAR-type piezoelectric thin-film resonator may be a cavity that is formed between the lower electrode and the substrate by performing wet etching on a sacrifice layer formed on the surface of the substrate, or may be a via hole that is formed in the substrate by performing wet etching or dry etching. A SMR-type piezoelectric thin-film resonator has an acoustic multilayer film, instead of a cavity. The acoustic multilayer film is formed by stacking films having high acoustic impedance and films having low acoustic impedance alternately, and has a film thickness of $\lambda/4$ ($\lambda$: the wavelength of acoustic waves).

An FBAR having a via hole is disclosed in "ZnO/SiO$_2$-Diaphragm Composite Resonator on a Silicon Wafer (K. Nakamura, H. Sasaki, and H. Shimizu, Electronics Letters, vol. 17, No. 14, pp. 507-509, July 1981)". A FBAR having a cavity is disclosed in Japanese Patent Application Publication No. 60-189307. FIG. 1 is a cross-sectional view of an FBAR having a via hole 18. FIG. 2 is a cross-sectional view of an FBAR having a cavity 18. As shown in FIG. 1, a lower electrode 12, a piezoelectric film 14, and an upper electrode 16 are formed in this order on a substrate 10 that has a SiO$_2$ film 11 formed on its surface and is made of silicon. A cavity 18 (a via hole) is formed in the substrate 10 below a portion at which the lower electrode 12 and the upper electrode 16 face each other. As shown in FIG. 2, a SiO$_2$ film 11 is formed as a supporting film on a substrate 10 made of silicon, so that a cavity 18 (a cavity) can be formed. A lower electrode 12, a piezoelectric film 14, and an upper electrode 16 are formed in this order on the SiO$_2$ film 11. The lower electrode 12 and the upper electrode 16 partially face each other, with the piezoelectric film 14 being interposed between the facing portions of the lower electrode 12 and the upper electrode 16.

Here, the lower electrode 12 and the upper electrode 16 may be made of aluminum, (Al), copper (Cu), molybdenum (Mo), tungsten (W), tantalum (Ta), platinum (Pt), ruthenium (Ru), rhodium (Rh), iridium (Ir), chromium (Cr), titanium (Ti), or the like. The lower electrode 12 and the upper electrode 16 may be stack materials formed by combining some of those materials. The piezoelectric film 14 may be made of aluminum nitride (AlN), zinc oxide (ZnO), lead zirconate titanate (PZT), lead titanate (PbTiO$_3$), or the like. The substrate 10 may be a silicon substrate, a glass substrate, a GaAs substrate, or the like.

When a high-frequency electric signal is applied between the upper electrode and the lower electrode, acoustic waves are generated by an inverse piezoelectric effect in the piezoelectric film interposed between the upper electrode and the lower electrode, or acoustic waves are generated by the deformation caused by a piezoelectric effect. Those acoustic waves are converted into electric signals. Since such acoustic waves are all reflected by the faces of the upper electrode and the lower electrode exposed to the air, longitudinal oscillatory waves having principal displacement in the thickness direction are generated. Resonance is caused at a frequency at which the total film thickness H of the film stack consisting of the lower electrode, the piezoelectric film, and the upper electrode (including the film added onto the upper electrode) is equal to an integral multiple (n times) of ½ of the wavelength $\lambda$ of the acoustic waves The resonant frequency F is expressed as: $F=nV/(2H)$, where V represents the propagation velocity of acoustic waves determined by the material. In view of this, the resonant frequency F can be controlled by adjusting the total film thickness H of the stack film, and a piezoelectric thin-film resonator with desired frequency characteristics can be obtained.

Japanese Patent Application Publication No. 2005-536908 of the PCT international publication for a patent application discloses a technique by which an insulating film is provided at the same height as the lower electrode on the substrate, and the step portion is removed from the lower electrode, so as to prevent the degradation of the crystallinity of the piezoelectric film due to the step portion of the lower electrode. Japanese Patent Application Publication No. 2002-140075 discloses a technique by which the step portion of the lower electrode is placed directly on the substrate, so as to prevent the degradation of the crystallinity of the piezoelectric film due to the step portion of the lower electrode. Japanese Patent Application Publication No. 2006-254295 discloses a technique by which the corners of the resist pattern to be used for the formation of the lower electrode are rounded, so as to prevent the degradation of the crystallinity of the piezoelectric film due to the step portion of the lower electrode.

An AlN film is often used as the piezoelectric film, so as to achieve desired acoustic velocity, desired temperature characteristics, and desired sharpness of resonance peaks (the Q value). Particularly, the formation of an AlN film having crystallinity oriented toward the c-axis (oriented in a direction perpendicular to the surface of the lower electrode (the (002) direction)) is one of the essential factors to determine the resonance characteristics. However, the formation of an AlN film having high crystallinity oriented toward the c-axis requires a large amount of energy. For example, where a film is formed by MOCVD (Metal Organic Chemical Vapor Deposition), it is necessary to heat the substrate to 1000° C. or higher. Where a film is formed by PECVD (Plasma Enhanced Chemical Vapor Deposition), it is necessary to provide plasma power and heat the substrate to 400° C. or higher. Also, where a film is formed by a sputtering technique, a temperature rise is caused in the substrate by the sputtering of the insulating film. Therefore, an AlN film has high film stress.

The lower electrode has the step portion, and the side wall of the step portion is tapered. The piezoelectric film is formed to cover the step portion of the lower electrode. As a result, the crystallinity of the piezoelectric film becomes lower at the step portion of the lower electrode, and there is the problem of degradation of the resonance characteristics of the piezoelectric thin-film resonator.

In accordance with Japanese Patent Application Publication No. 2005-536908 of the PCT international publication for a patent application, after an insulating film is formed to cover the step portion of the lower electrode, the surfaces of the lower electrode and the insulating film are flattened by polishing the surfaces so as to remove the step portion of the lower electrode. The film thickness of the lower electrode affects the resonant frequency. Therefore, it is difficult to perform the surface polishing without causing unevenness in the film thickness in the wafer plane and between wafers, while the film thickness control performed on the lower electrode by the surface polishing is essential. Also, the deposition of the insulating film and the surface polishing increase the number of manufacturing procedures. As a result, the productivity becomes lower, and the production costs become higher.

The technique disclosed in Japanese Patent Application Publication No. 2002-140075 can cope with a piezoelectric film having high film stress, and improves the mechanical strength and the Q value. By this technique, however, the electromechanical coupling coefficient ($k^2$) becomes lower.

SUMMARY OF THE INVENTION

It is therefore an object of the present invention to provide a piezoelectric thin-film resonator and a filter including the piezoelectric thin-film resonator in which the above disadvantages are eliminated.

A more specific object of the present invention is to provide a piezoelectric thin-film resonator that can have resonance characteristics improved, and a filter including the piezoelectric thin-film resonator.

According to an aspect of the present invention, there is provided a piezoelectric thin-film resonator including: a lower electrode that is formed on a substrate; a piezoelectric film that is formed on the substrate and the lower electrode; an upper electrode that is formed on the piezoelectric film, with a portion of the piezoelectric film being interposed between the lower electrode and the upper electrode facing each other; and an additional film that is formed on the substrate on at least a part of an outer periphery of the lower electrode at the portion at which the lower electrode and the upper electrode face each other, the additional film being laid along the lower electrode. Thus, cracks that are normally formed due to degradation of the crystallinity of the piezoelectric film at the step portion of the lower electrode are not formed, and the resonance characteristics can be improved.

According to another aspect of the present invention, there is provided a filter including piezoelectric thin-film resonators configured as mentioned above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
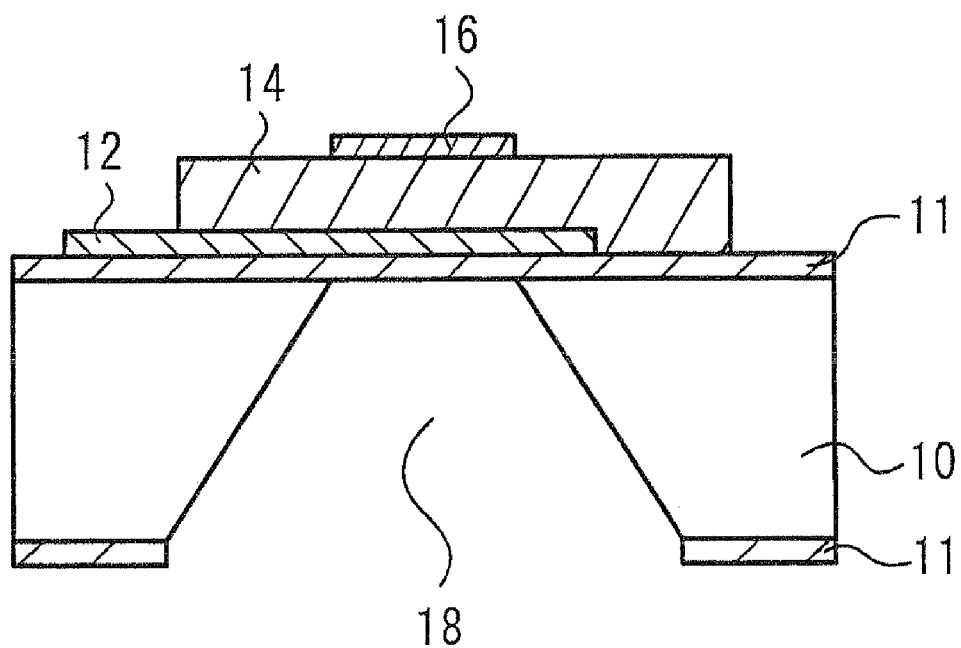
FIG. 1 is a cross-sectional view of a piezoelectric thin-film resonator having a cavity of a via-hole type.
Figure 2:
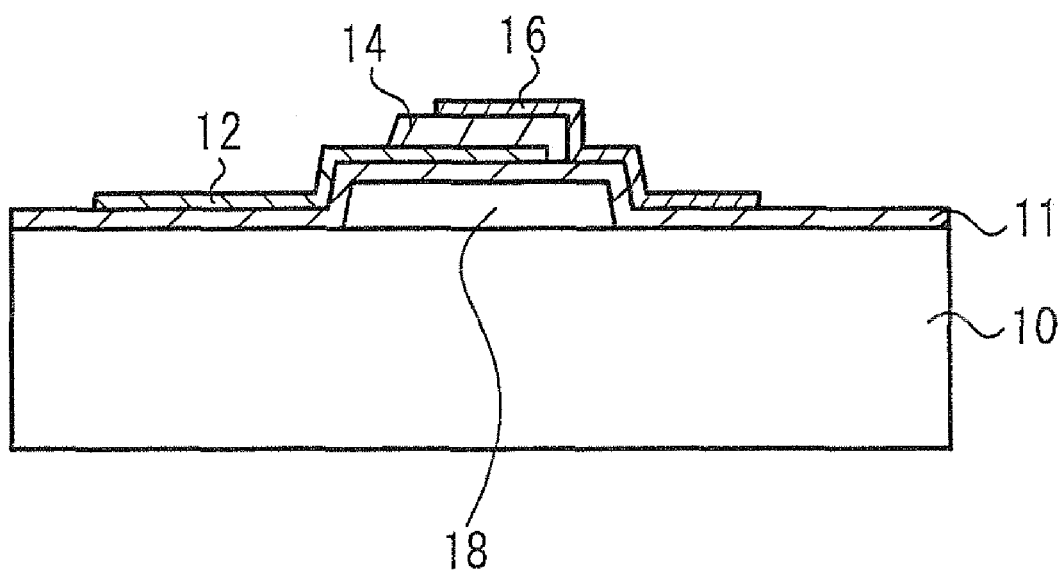
FIG. 2 is a cross-sectional view of a piezoelectric thin-film resonator having a cavity of a cavity type.
Figure 3A:
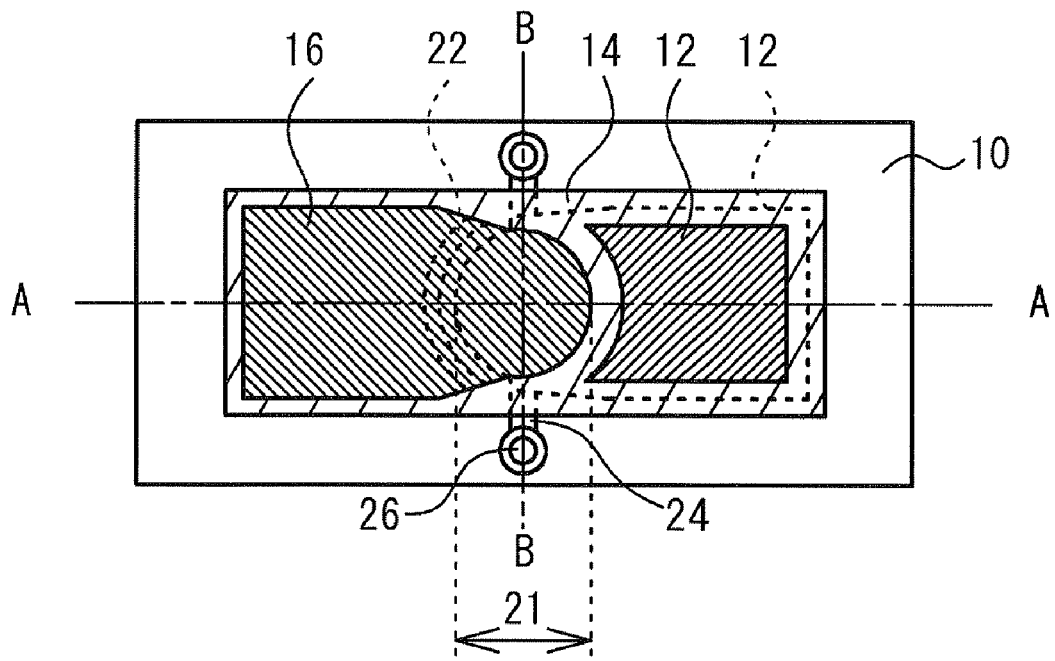
FIG. 3A is a top view of a piezoelectric thin-film resonator in accordance with a first embodiment of the present invention.
Figure 3B:
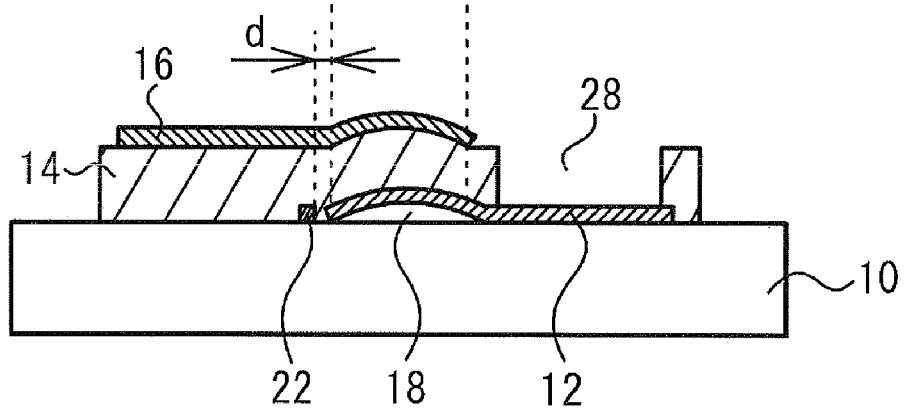
FIG. 3B is a cross-sectional view of the piezoelectric thin-film resonator, taken along the line A-A of FIG. 3A.
Figure 3C:
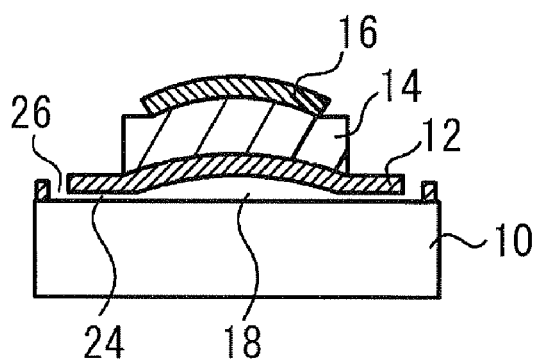
FIG. 3C is a cross-sectional view of the piezoelectric thin-film resonator, taken along the line B-B of FIG. 3A.
Figure 4A:
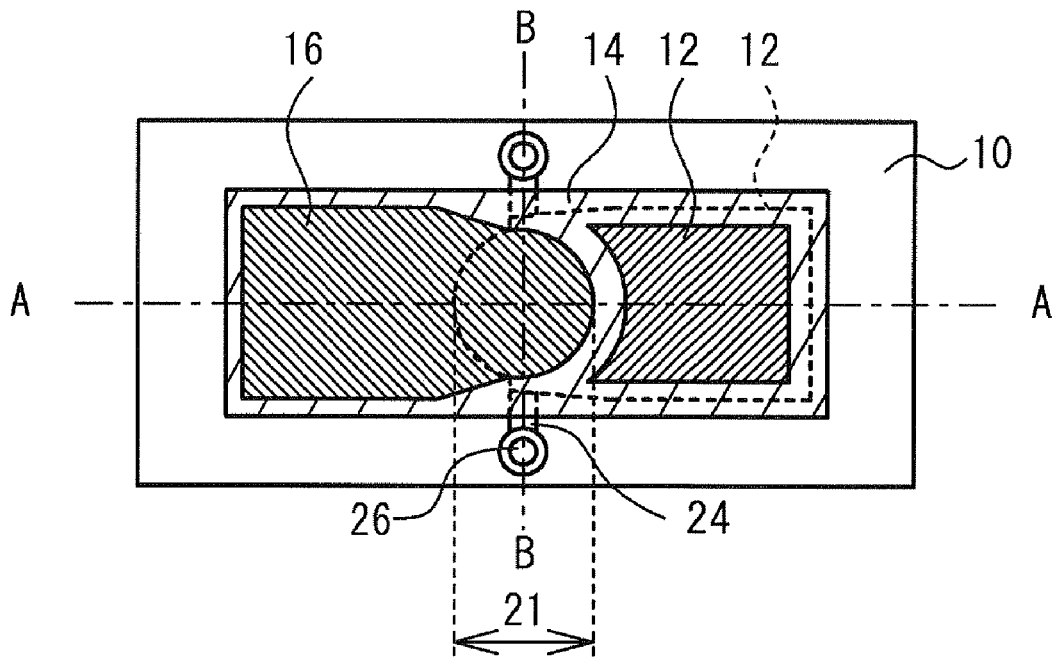
FIG. 4A is a top view of a piezoelectric thin-film resonator in accordance with a first comparative example.
Figure 4B:
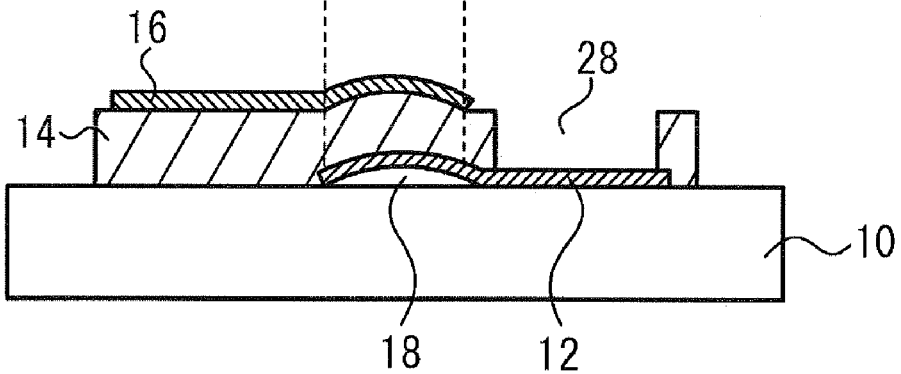
FIG. 4B is a cross-sectional view of the piezoelectric thin-film resonator, taken along the line A-A of FIG. 4A.
Figure 4C:
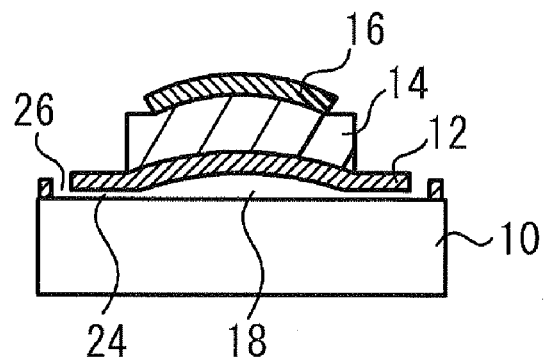
FIG. 4C is a cross-sectional view of the piezoelectric thin-film resonator, taken along the line B-B of FIG. 4A.

FIG. 3A is a top view of a piezoelectric thin-film resonator in accordance with a first embodiment. FIG. 3B is a cross-sectional view of the piezoelectric thin-film resonator, taken along the line A-A of FIG. 3A. FIG. 3C is a cross-sectional view of the piezoelectric thin-film resonator, taken along the line B-B of FIG. 3A. FIG. 4A is a top view of a piezoelectric thin-film resonator in accordance with a first comparative example. FIG. 4B is a cross-sectional view of the piezoelectric thin-film resonator, taken along the line A-A of FIG. 4A. FIG. 4C is a cross-section alview of the piezoelectric thin-film resonator, taken along the line B-B of FIG. 4A.

As shown in FIGS. 3A through 3C, the piezoelectric thin-film resonator in accordance with the first embodiment has a lower electrode 12 that is made of Ru, has a thickness of 260 nm, and is formed on a substrate 10 that is formed with a (100)-cut silicon substrate. A piezoelectric thin film 14 that has a thickness of 1220 nm and is formed with an AlN film having the principal axis extending in the (002) direction is provided on the substrate 10 and the lower electrode 12. An upper electrode 16 that is made of Ru and has a thickness of 260 nm is provided on the piezoelectric film 14, with a part of the piezoelectric film 14 being interposed between the lower electrode 12 and the upper electrode 16. With this structure, a film stack consisting of the lower electrode 12, the piezoelectric film 14, and the upper electrode 16 is formed. At the portion at which the lower electrode 12 and the upper electrode 16 face each other (a resonant portion 21), an additional film 22 made of the same material (Ru) as the lower electrode 12 is provided on the substrate 10 and at least along a part of the outer periphery of the lower electrode 12. The distance d between the lower electrode 12 and the additional film 22 at the portion at which the lower electrode 12 and the upper electrode 16 face each other is 2.0 µm. The thickness of the additional film 22 is 260 nm, and the width is 4 µm. The resonant portion 21 has an oval shape. The length of the long axis of the resonant portion 21 is 250 µm, and the length of the short axis is 180 µm.

A cavity 18 having a dome-like shape is formed between the substrate 10 and the lower electrode 12 below the resonant portion 21. With the dome-like shape, the cavity 18 has a larger height at the center than at the peripheral portions. The resonant portion 21 is included in a region formed by projecting the cavity 18 onto the substrate 10. An introduction path 24 for etching a later described sacrifice layer is provided in the lower electrode 12. The end of the instruction path 24 is not covered with the piezoelectric film 14, and the lower electrode 12 has a hole 26 at the end of the instruction path 24. The piezoelectric film 14 has an opening portion 28 so as to provide an electric connection with the lower electrode 12.

As shown in FIGS. 4A through 4C, the piezoelectric thin-film resonator in accordance with the first comparative example does not have the additional film 22 formed on the substrate 10. The other aspects of the structure are the same as those of the first embodiment illustrated in FIGS. 3A through 3C, and therefore, explanation of them is omitted here.

Figure 5A:
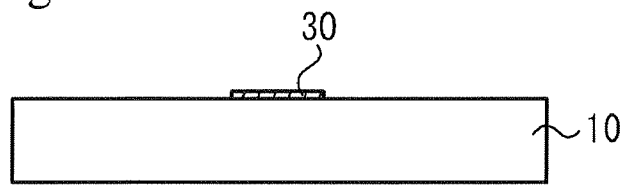
FIGS. 5A through 5H are cross-sectional views illustrating a method for manufacturing the piezoelectric thin-film resonator in accordance with the first embodiment.
Figure 5E:
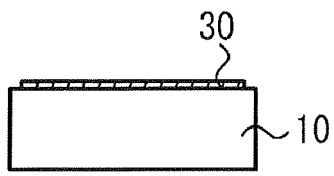

Referring now to FIGS. 5A through 5H, a method for manufacturing the piezoelectric thin-film resonator in accordance with the first embodiment is described. FIGS. 5A through 5D are cross-sectional views of the piezoelectric thin-film resonator, taken along the line A-A of FIG. 3A. FIGS. 5E through 5H are cross-sectional views of the piezoelectric thin-film resonator, taken along the line B-B of FIG. 3A. As shown in FIGS. 5A and 5E, a sacrifice layer 30 that is made of MgO (magnesium oxide) and has a thickness of approximately 20 nm is formed on the substrate 10 by a sputtering technique or a vapor deposition technique. After that, the sacrifice layer 30 is shaped into a predetermined form by an exposure technique and an etching technique.

Figure 5B:
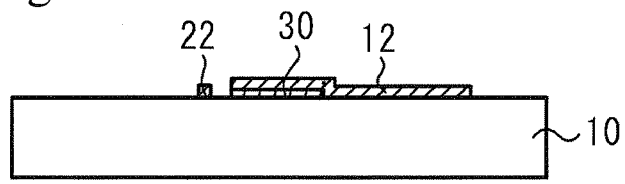
Figure 5F:
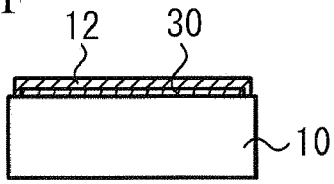

As shown in FIGS. 5B and 5F, the lower electrode 12 is formed by sputtering Ru in an Ar gas atmosphere under a pressure of 0.6 to 1.2 Pa. After that, the lower electrode 12 is shaped into a predetermined form by an exposure technique and an etching technique. Here, the additional film 22 is formed at the same time.

Figure 5C:
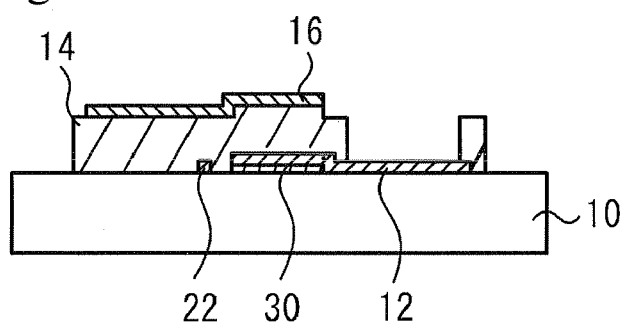
Figure 5G:
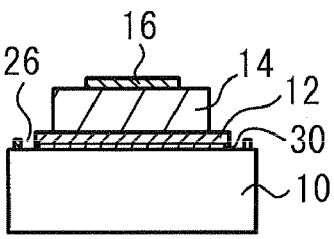

As shown in FIGS. 5C and 5G, the piezoelectric film 14 is formed on the lower electrode 12 and the substrate 10 by sputtering Al in an Ar/N$_2$ mixed gas atmosphere under a pressure of approximately 0.3 Pa. The upper electrode 16 is formed on the piezoelectric film 14 by sputtering Ru in an Ar gas atmosphere under a pressure of 0.6 to 1.2 Pa. After that, the piezoelectric film 14 and the upper electrode 16 are shaped into predetermined forms by an exposure technique and an etching technique. Further, the hole 26 is formed at the end of the instruction path 24 by an exposure technique and an etching technique. The hole 26 is formed at the same time as the lower electrode 12.

Figure 5D:
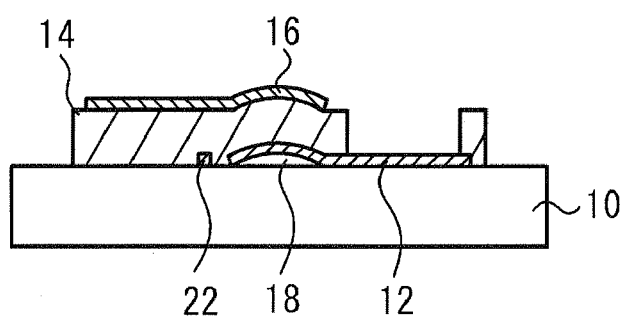
Figure 5H:
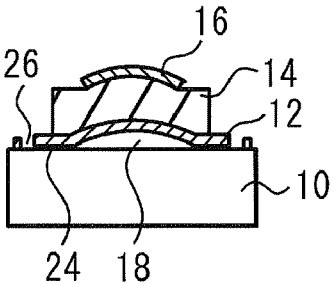

As shown in FIG. 5D and 5H, an etching solution for etching the sacrifice layer 30 is introduced through the instruction path 24, and the sacrifice layer 30 is removed. Here, the stress on the film stack consisting of the lower electrode 12, the piezoelectric film 14, and the upper electrode 16 is set to be compressive stress by adjusting the sputtering conditions. Accordingly, when the etching of the sacrifice layer 30 is completed, the film stack expands to form the cavity 18 having a dome-like shape between the lower electrode 12 and the substrate 10. The compressive stress on the combined film under the sputtering conditions of the first embodiment is −300 MPa. In this manner, the piezoelectric thin-film resonator in accordance with the first embodiment is completed.

Figure 6A:
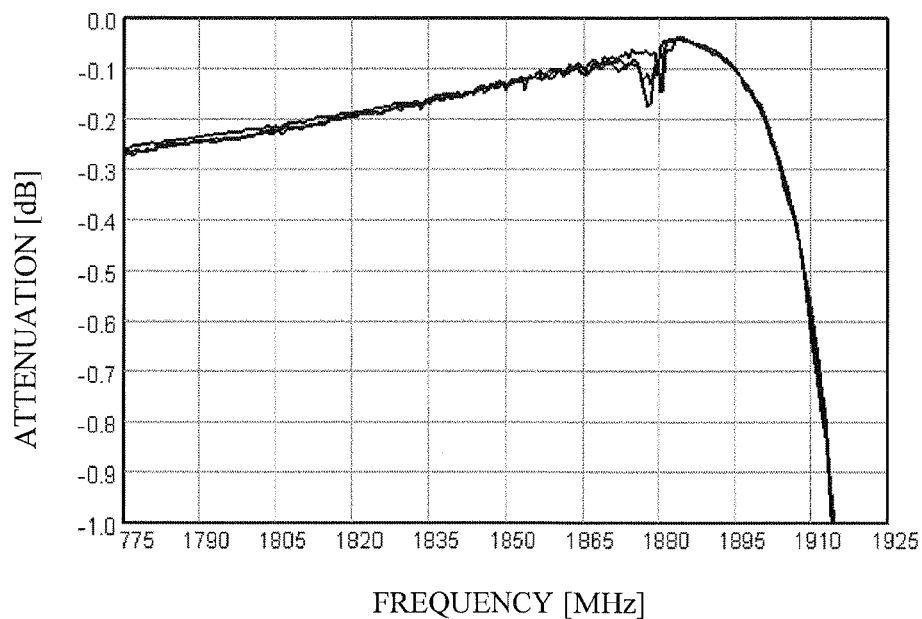
FIG. 6A shows the resonance characteristics of the piezoelectric thin-film resonator in accordance with the first comparative example.
Figure 6B:
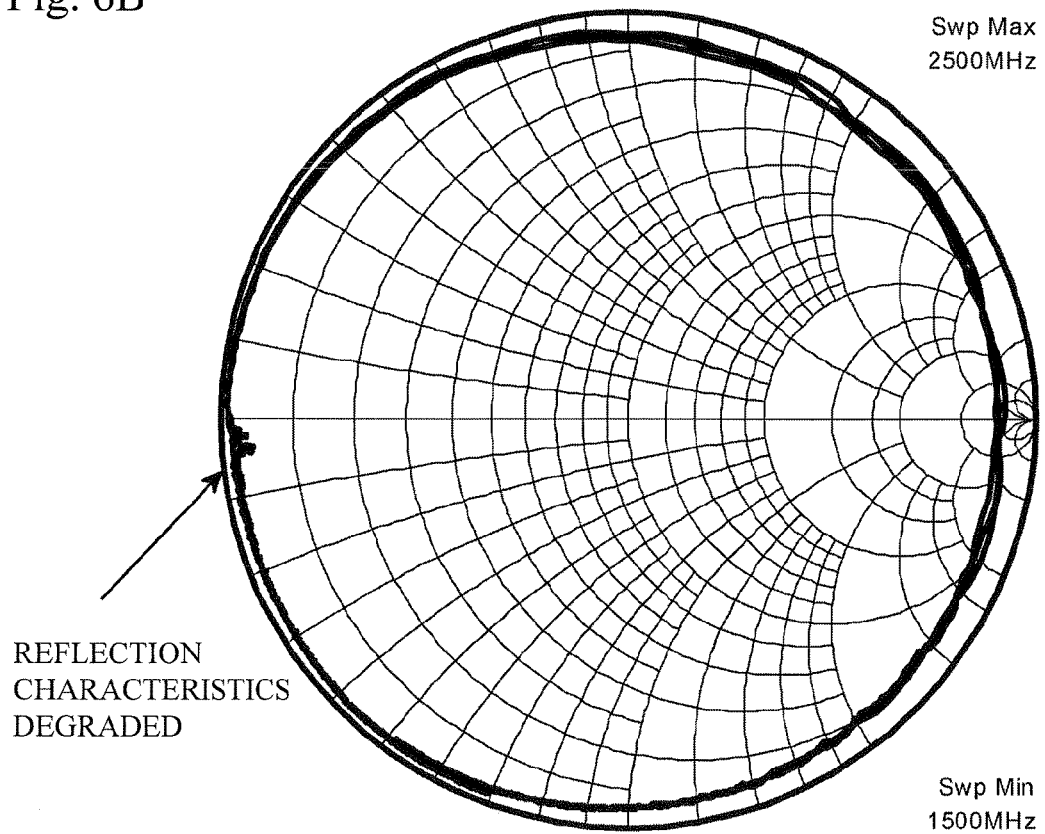
FIG. 6B shows a Smith chart illustrating the reflection characteristics of the piezoelectric thin-film resonator in accordance with the first comparative example.
Figure 7A:
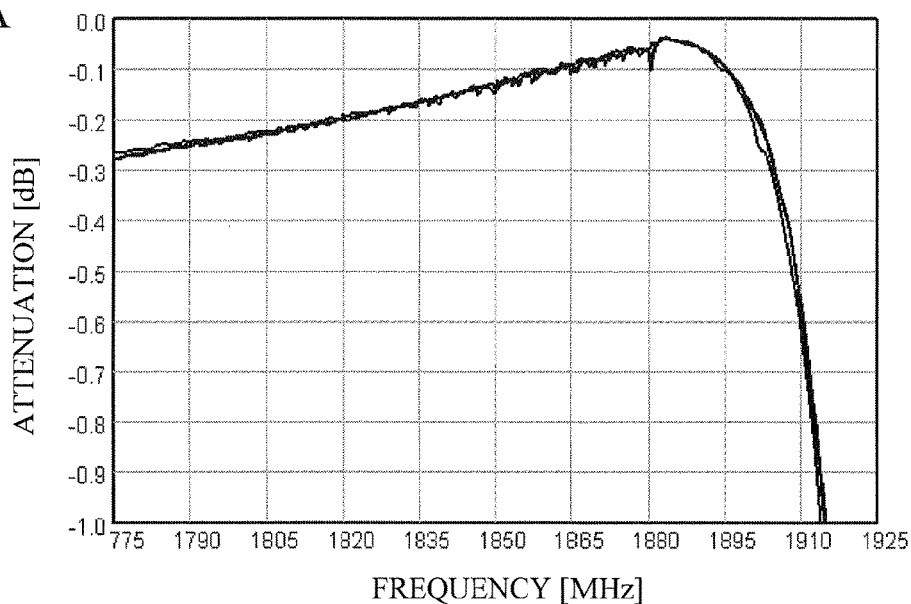
FIG. 7A shows the resonance characteristics of the piezoelectric thin-film resonator in accordance with the first embodiment.
Figure 7B:
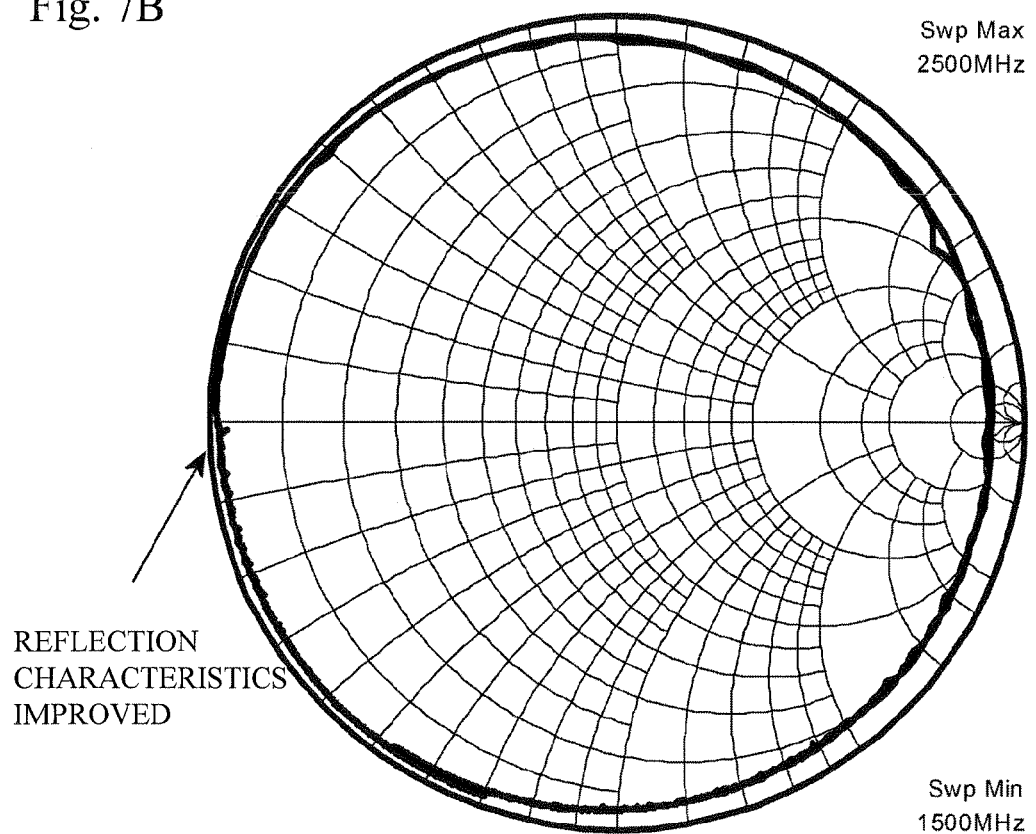
FIG. 7B shows a Smith chart illustrating the reflection characteristics of the piezoelectric thin-film resonator in accordance with the first embodiment.

FIG. 6A shows the resonance characteristics of the piezoelectric thin-film resonator in accordance with the first comparative example. FIG. 6B shows a Smith chart illustrating the reflection characteristics of the piezoelectric thin-film resonator in accordance with the first comparative example. FIG. 7A shows the resonance characteristics of the piezoelectric thin-film resonator in accordance with the first embodiment. FIG. 7B shows a Smith chart illustrating the reflection characteristics of the piezoelectric thin-film resonator in accordance with the first embodiment. FIGS. 6A through 7B show the resonance characteristics and the reflection characteristics of piezoelectric thin-film resonators located at three points in a wafer. In FIGS. 6A and 7A, the abscissa axis indicates frequency [MHz], and the ordinate axis indicates attenuation [dB].

As shown in FIG. 6A, with the piezoelectric thin-film resonator in accordance with the first comparative example, ripples are formed at frequencies (in the neighborhood of 1880 MHz) slightly lower than the resonant frequency, and the resonance characteristics are degraded. As can be seen from the Smith chart of FIG. 6B, the reflection characteristics are also degraded (as indicated by the arrow in FIG. 6B). As shown in FIG. 7A, with the piezoelectric thin-film resonator in accordance with the first embodiment, ripples are prevented at frequencies (in the neighborhood of 1880 MHz) slightly lower than the resonant frequency, and the resonance characteristics are improved. As can be seen from FIG. 7B, the reflection characteristics are also improved (as indicated by the arrow in FIG. 7B).

Figure 8:
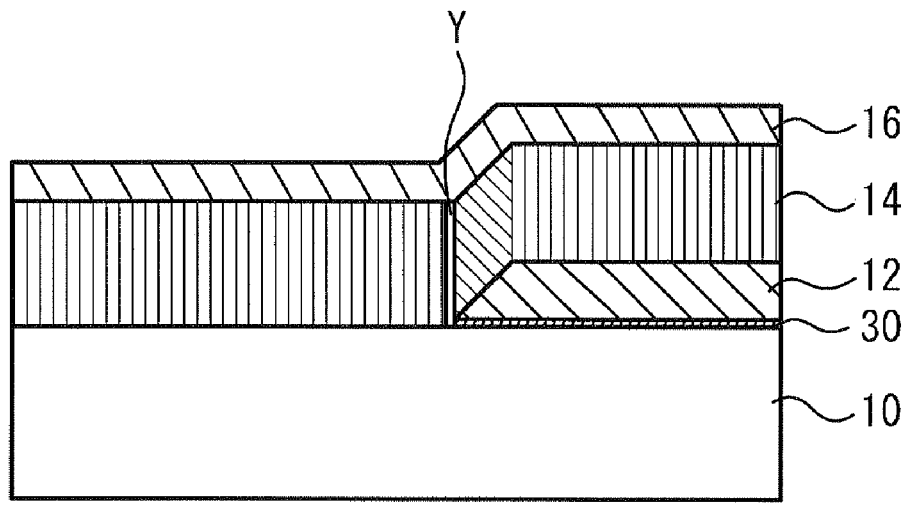
FIG. 8 is a cross-sectional view illustrating the cause of degradation of the resonance characteristics in the first comparative example.

FIG. 8 is a cross-sectional view illustrating the cause of degradation of the resonance characteristics of the piezoelectric thin-film resonator in accordance with the first comparative example. More specifically, FIG. 8 is a cross-sectional view showing the piezoelectric thin-film resonator before etching is performed on the sacrifice layer 30 (before the cavity 18 is formed). FIG. 8 is also an enlarged view of the step portion of the lower electrode 12. The thin lines in the piezoelectric film 14 represent the columnar crystalline structure of the piezoelectric film 14 (AlN film). As shown in FIG. 8, the step portion of the lower electrode 12 has a tapered shape. The columnar crystalline structure of the piezoelectric film 14 is perpendicular to the substrate 10 and to the upper face of the lower electrode 12, and is also perpendicular to the tapered portion of the step portion of the lower electrode 12. Therefore, the crystallinity of the piezoelectric film 14 is degraded in the region Y. As a result, cracks are formed in the region Y due to the stress generated when the dome-like cavity 18 is formed as shown in FIGS. 5D and 5H. Those cracks degrade the resonance characteristics.

Figure 9:
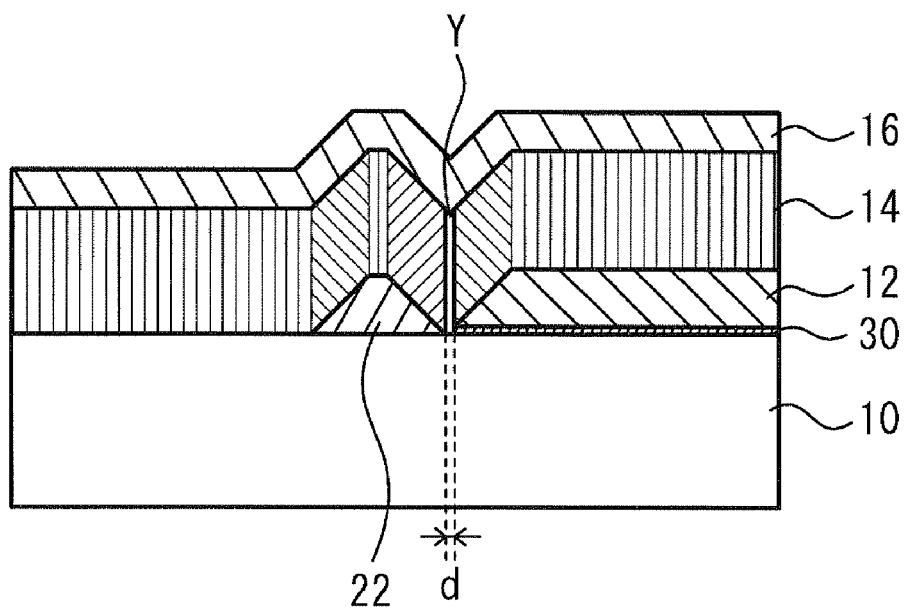
FIG. 9 is a cross-sectional view illustrating the reason that the resonance characteristics can be improved in the first embodiment.

FIG. 9 is a cross-sectional view and an enlarged view of the step portion of the lower electrode 12 of the piezoelectric thin-film resonator in accordance with the first embodiment (before etching is performed on the sacrifice layer 30). As shown in FIG. 9, the additional film 22 is provided at a distance d of 2.0 μm from the lower electrode 12, so as to prevent cracks in the region Y Accordingly, the resonance characteristics can be improved. The distance d is not limited to 2.0 μm, but the crystallinity of the piezoelectric film 14 at the step portion of the lower electrode 12 becomes similar to the crystallinity of the first comparative example if the distance d is too long. Therefore, it is preferable that the distance d is 2.0 μm or shorter.

In accordance with the first embodiment, the additional film 22 is provided on the substrate 10 and at least along a part of the outer periphery of the lower electrode 12 at the portion at which the lower electrode 12 and the upper electrode 16 face each other, as shown in FIGS. 3A through 3C. The piezoelectric film 14 is provided on the substrate 10 and the lower electrode 12, so as to cover the additional film 22. With this arrangement, cracks to be formed due to degradation of the crystallinity of the piezoelectric film 14 at the step portion of the lower electrode 12 can be prevented as illustrated in FIG. 9. Accordingly, fewer ripples are formed in the piezoelectric thin-film resonator in accordance with the first embodiment than in the piezoelectric thin-film resonator in accordance with the first comparative example, and the resonance characteristics can be improved. In the first embodiment, the electromechanical coupling coefficient ($k^2$) and the resonance peak sharpness (Q value) are the same as those in the first comparative example.

It is also preferable that the lower electrode 12 and the additional film 22 are made of the same material (Ru), as shown in FIGS. 3A through 3C. In that case, the lower electrode 12 and the additional film 22 can be formed at the same time as shown in FIGS. 5B and 5F, and higher productivity can be achieved.

Further, the cavity 18 having a dome-like shape is formed between the substrate 10 and the lower electrode 12 below the portion at which the lower electrode 12 and the upper electrode 16 face each other, as shown in FIGS. 3A through 3C. Accordingly, there is no need to perform etching on the substrate 10. Thus, higher productivity can be achieved, and degradation of the mechanical strength of the substrate 10 can be prevented. Also, since the region for forming the cavity 18 is small, higher integration can be achieved. Furthermore, as the sacrifice layer 30 provided to form the cavity 18 is thin, excellent orientation can be maintained in the piezoelectric film 14.

Further, the stress on the film stack consisting of the lower electrode 12, the piezoelectric film 14, and the upper electrode 16, or the stress on the portion at which the lower electrode 12 and the upper electrode 16 face each other, is compressive stress, as illustrated in FIGS. 3A through 3C. With this arrangement, the cavity 18 having a dome-like shape can be protected from deformation. Also, the hole 26 continuing to the cavity 18 is formed in the lower electrode 12. With this arrangement, the cavity 18 having a dome-like shape can be formed by introducing an etching solution through the hole 26 and performing etching on the sacrifice layer 30, as illustrated in FIGS. 5D and 5H.

The portion at which the lower electrode 12 and the upper electrode 16 face each other is included in the region formed by projecting the cavity 18 having a dome-like shape onto the substrate 10, as illustrated in FIGS. 3A through 3C. Accordingly, the portion (the resonant portion 21) at which the lower electrode 12 and the upper electrode 16 face each other can oscillate. Also, the cavity 18 does not need to have a dome-like shape. The resonant portion 21 can oscillate, as long as the portion at which the lower electrode 12 and the upper electrode 16 face each other is included in the region formed by projecting the cavity 18 onto the substrate 10.

Further, the portion at which the lower electrode 12 and the upper electrode 16 face each other has an oval shape, and no two sides run parallel to each other, as illustrated in FIGS. 3A through 3C. With this arrangement, acoustic waves reflected by the outer periphery of the piezoelectric film 14 can be prevented from turning into transverse standing waves in the resonant portion 21. Thus, ripples do not appear in the resonance characteristics.

Further, the piezoelectric film 14 is made of aluminum nitride with an orientation having the principal axis extending in the (002) direction, as illustrated in FIGS. 3A through 3C. With this arrangement, a piezoelectric thin-film resonator having excellent resonance characteristics can be formed. Also, zinc oxide with an orientation having the principal axis extending in the (002) direction may be used to achieve excellent resonance characteristics.

Although the substrate 10 is a silicon substrate in the first embodiment, it is possible to use a quartz substrate, a glass substrate, a GaAs substrate, or the like. Also, the lower electrode 12 and the upper electrode 16 are made of Ru in the first embodiment, but those materials mentioned in the description of the related art may also be employed. Although the sacrifice layer 30 is a MgO layer in the first embodiment, it is possible to use a material that can readily dissolve in an etching solution, such as ZnO, Ge, Ti or $SiO_2$.

Second Embodiment

Figure 10:
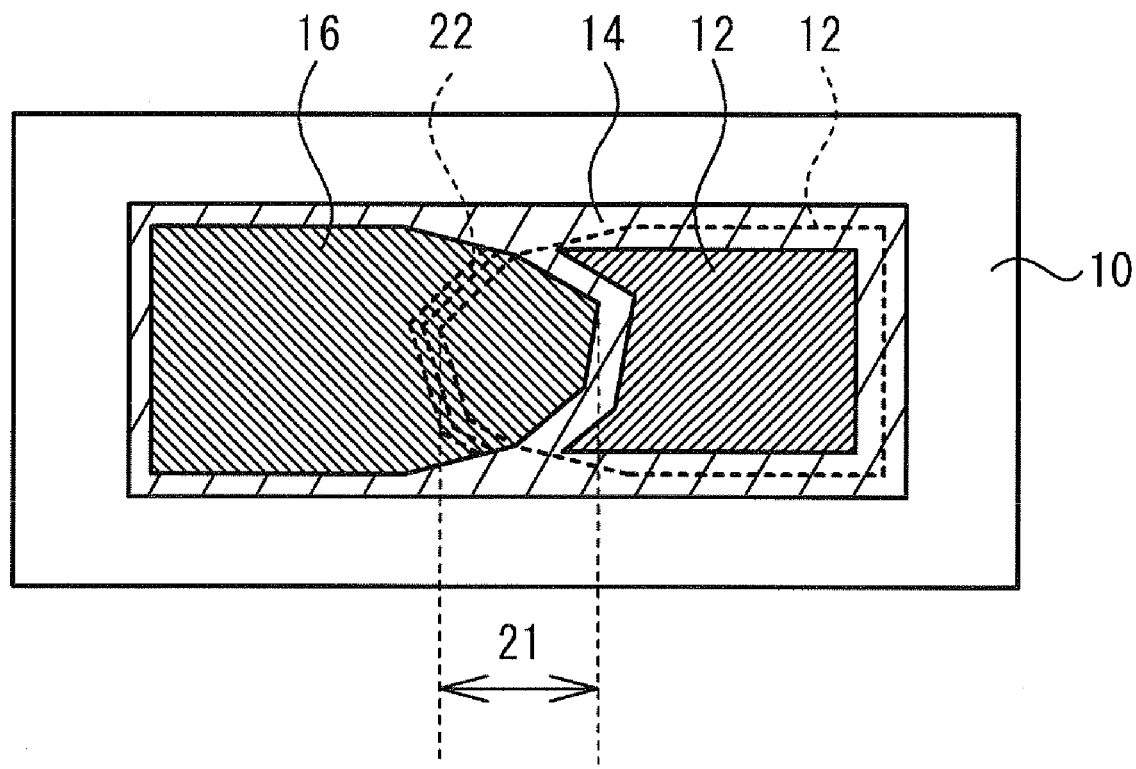
FIG. 10 is a top view of a piezoelectric thin-film resonator in accordance with a second embodiment of the present invention.

FIG. 10 is a top view of a piezoelectric thin-film resonator in accordance with a second embodiment of the present invention. As shown in FIG. 10, the portion (the resonant portion 21) at which the lower electrode 12 and the upper electrode 16 face each other has a polygonal shape formed with nonparallel sides. The other aspects of the structure are the same as those of the first embodiment illustrated in FIGS. 3A through 3C, and therefore, explanation of them is omitted here.

In accordance with the second embodiment, the portion at which the lower electrode 12 and the upper electrode 16 face each other has a polygonal shape formed with nonparallel sides. Since there are no two parallel sides, acoustic waves reflected by the outer periphery of the piezoelectric film 14 can be prevented from turning into transverse standing waves in the resonant portion 21. Thus, ripples do not appear in the resonance characteristics.

Third Embodiment

Figure 11:
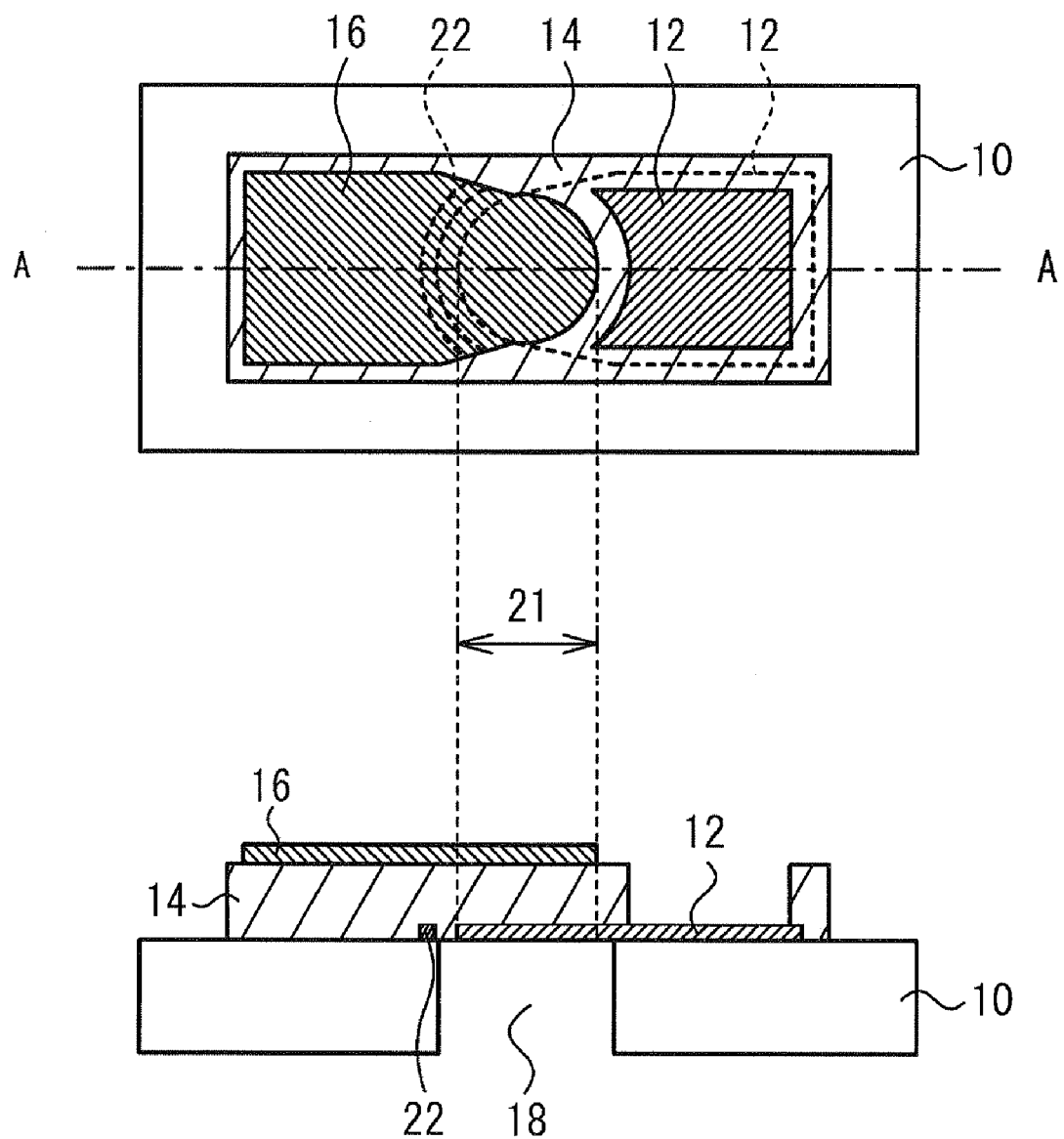
FIG. 11 shows a top view (a) of a piezoelectric thin-film resonator in accordance with a third embodiment of the present invention, and a a cross-sectional view (b) of the piezoelectric thin-film resonator, taken along the line A-A of part (a)
Figure 12:
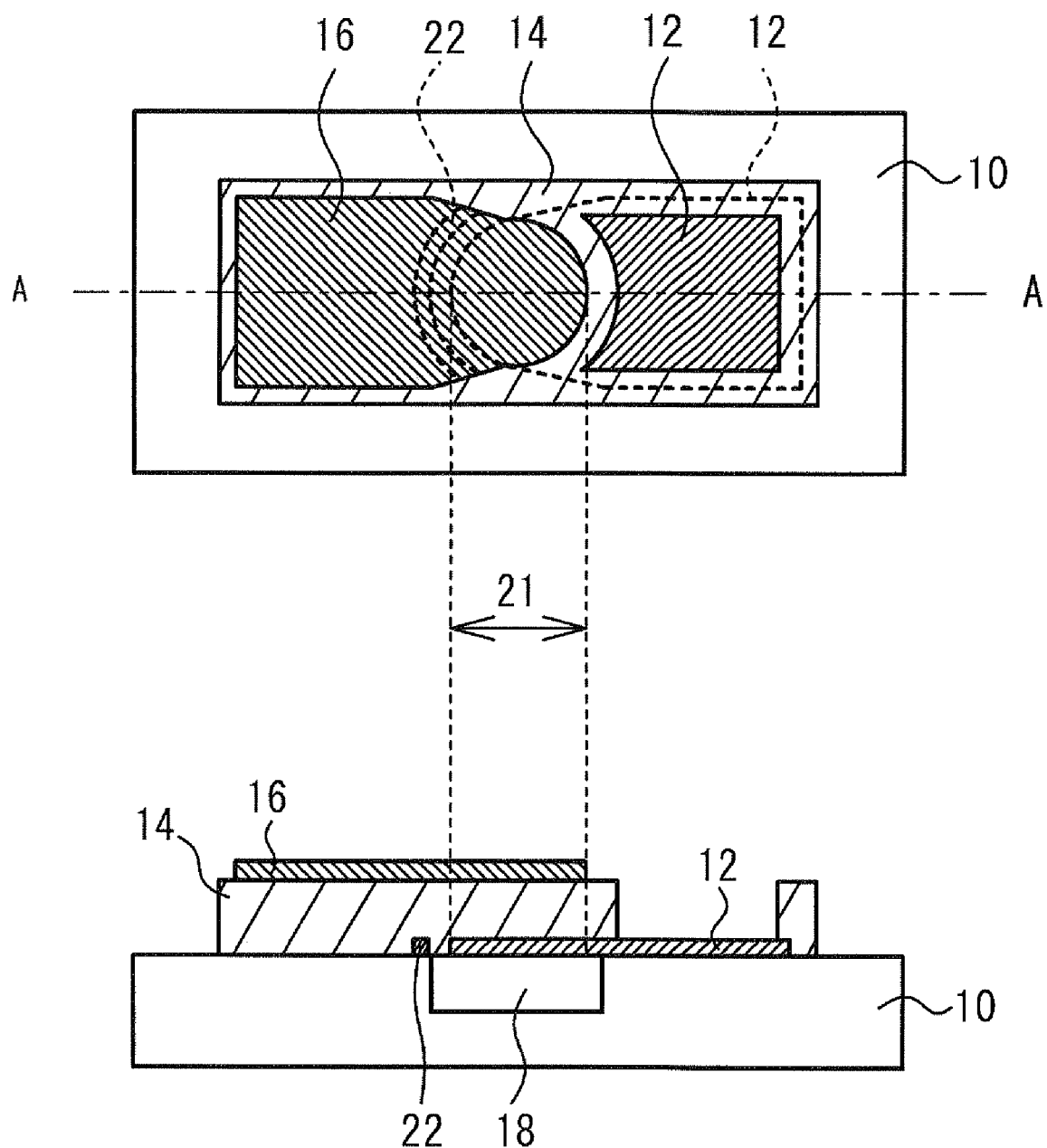
FIG. 12 shows a top view (a) of a piezoelectric thin-film resonator in accordance with a modification of the third embodiment, and a cross-sectional view (b) of the piezoelectric thin-film resonator, taken along the line A-A of part (a)

A third embodiment of the present invention is an example case where the cavity 18 is formed in the substrate 10. FIG. 11 shows a top view (a) of a piezoelectric thin-film resonator in accordance with the third embodiment, and a cross-sectional view (b) of the piezoelectric thin-film resonator, taken along the line A-A of part (a). FIG. 12 shows a top view of a piezoelectric thin-film resonator in accordance with a modification of the third embodiment, and a cross-sectional view of the piezoelectric thin-film resonator, taken along the line A-A of part (a). As shown in FIGS. 11 and 12, the cavity 18 may not be formed between the substrate 10 and the lower electrode 12 as in the first embodiment and the second embodiment, but may be formed in the substrate 10 under the portion (the resonant portion 21) at which the lower electrode 12 and the upper electrode 16 face each other in the third embodiment. The cavity 18 can be vertically formed by performing etching on the substrate 10 by Deep-RIE (Reactive Ion Etching).

Fourth Embodiment

Figure 13:
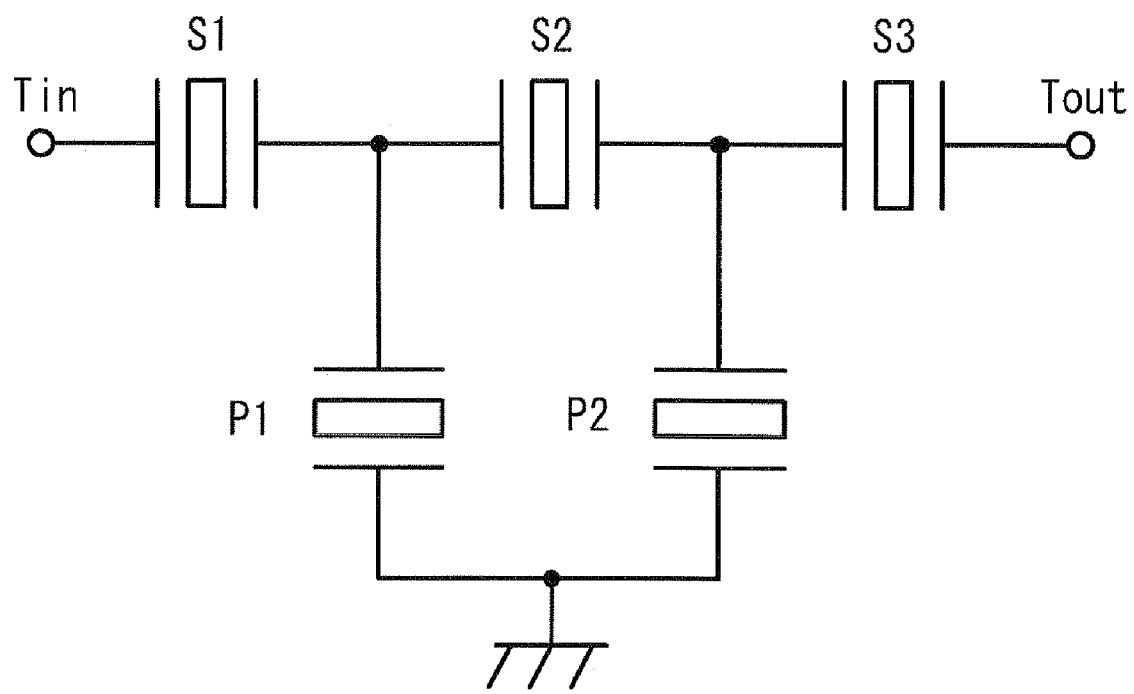
FIG. 13 is an equivalent circuit diagram of a ladder filter in accordance with a fourth embodiment of the present invention.

A fourth embodiment of the present invention is an example of a four-stage ladder filter that includes piezoelectric thin-film resonators of the first embodiment. FIG. 13 is a circuit diagram illustrating the ladder filter in accordance with the fourth embodiment. In a four-stage ladder filter, series-arm resonators S and parallel-arm resonators P between an input terminal Tin and an output terminal Tout normally form a S-P-P-S-S-P-P-S structure. In the fourth embodiment, however, the two series-arm resonators S in the middle are combined to form a series-arm resonator S2, and the two parallel-arm resonators P at either end are combined to form parallel-arm resonators P1 and P2. As shown in FIG. 13, the series-arm resonators S1, S2, and S3 are connected in series between the input terminal Tin and the output terminal Tout. The parallel-arm resonator P1 is connected between the ground and the node between the series-arm resonators S1 and S2. The parallel-arm resonator P2 is connected between the ground and the node between the series-arm resonators S2 and S3.

To obtain bandpass filter characteristics in a ladder filter, it is necessary to make the resonant frequency of the parallel-arm resonators lower than the resonant frequency of the series-arm resonators. Therefore, in this embodiment, the series-arm resonators are piezoelectric thin-film resonators of the first embodiment, and the parallel-arm resonators are piezoelectric thin-film resonators formed by providing a mass load film on each upper electrode 16 of piezoelectric thin-film resonators of the first embodiment. The mass load film is made of Ti and has a thickness of 130 nm.

Figure 14:
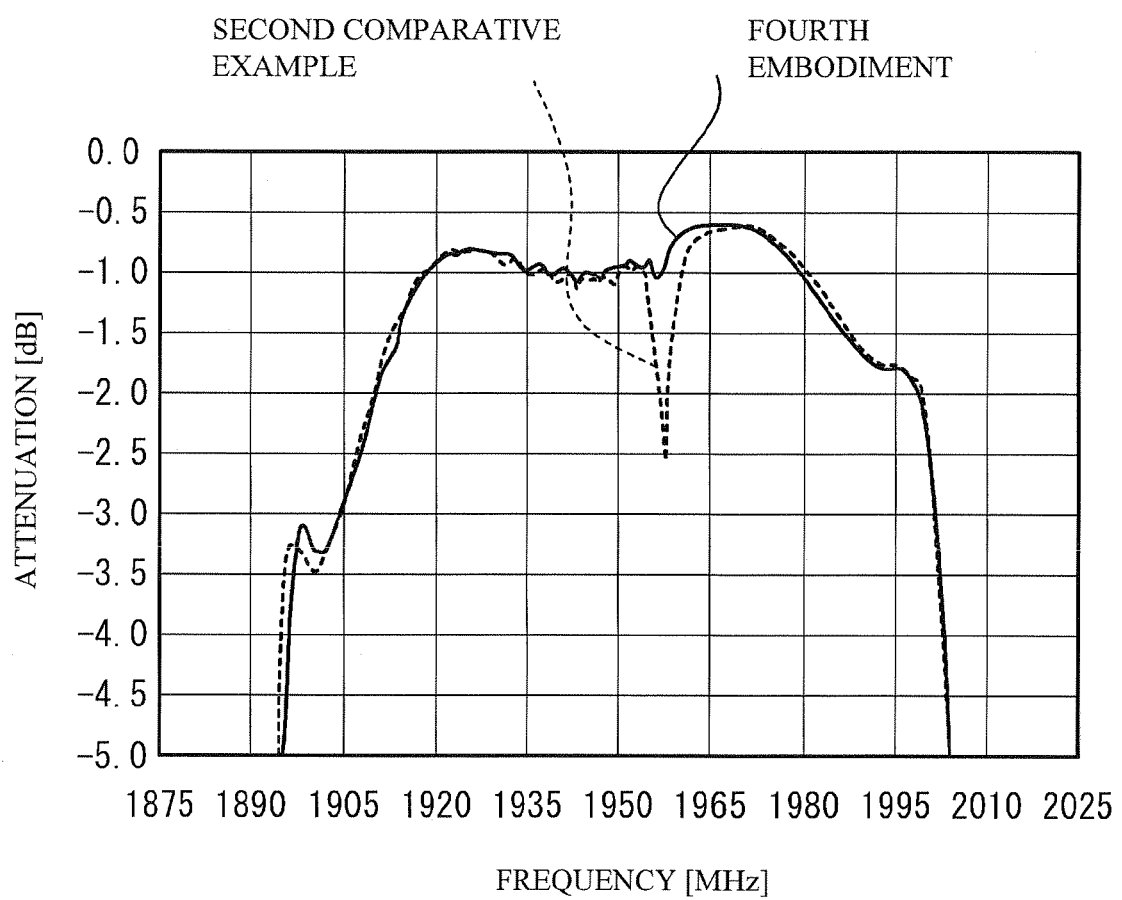
FIG. 14 shows the bandpass characteristics of the ladder filter in accordance with the fourth embodiment.

FIG. 14 shows the bandpass characteristics of the ladder filter in accordance with the fourth embodiment. For comparison, FIG. 14 also shows the bandpass characteristics of a ladder filter (a second comparative example) that includes piezoelectric thin-film resonators of the first comparative example as the series-arm resonators and the parallel-arm resonators (with a mass load film being formed on each upper electrode). A circuit diagram of the ladder filter of the second comparative example is the same as the circuit diagram of the fourth embodiment. In FIG. 14, the abscissa axis indicates frequency [MHz], and the ordinate axis indicates attenuation [dB]. As shown in FIG. 14, the bandpass characteristics of the ladder filter of the second comparative example (indicated by the broken line) have ripples formed in the pass band in the neighborhood of 1960 MHz. On the other hand, the bandpass characteristics of the ladder filter of the fourth embodiment (indicated by the solid line) have no ripples formed. Accordingly, the bandpass characteristics can be improved by employing piezoelectric thin-film resonators of the first embodiment in a ladder filter.

In the fourth embodiment, the series-arm resonators and the parallel-arm resonators are both formed with piezoelectric thin-film resonators of the first embodiment. However, the present invention is not limited to that arrangement. For example, ripples in the pass band can be prevented in a case where piezoelectric thin-film resonators of the first embodiment are used as the series-and resonators, and piezoelectric thin-film resonators of the first comparative example are used as the parallel-arm resonators. In a case where piezoelectric thin-film resonators of the first embodiment are used as the series-arm resonators and the parallel-arm resonators, ripples in the pass band can be prevented, and the attenuation characteristics of the lower frequency side of the pass band can be improved.

In the fourth embodiment, the ladder filter includes piezoelectric thin-film resonators of the first embodiment. However, the ladder filter may include piezoelectric thin-film resonators of the second embodiment and the third embodiment. Further, it is possible the employ piezoelectric thin-film resonators of the first through third embodiments in a filter other than a ladder filter, such as a multi-mode filter or a lattice filter.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2007-131094 filed on May 17, 2007, the entire disclosure of which is hereby incorporated by reference.

What is claimed is:

1. A piezoelectric thin-film resonator comprising:
a lower electrode that is formed on a substrate;
a piezoelectric film that is formed on the substrate and the lower electrode;
an upper electrode that is formed on the piezoelectric film, with a portion of the piezoelectric film being interposed between the lower electrode and the upper electrode facing each other; and
an additional film that is formed on the substrate on at least a part of an outer periphery of the lower electrode at the portion at which the lower electrode and the upper electrode face each other, the additional film being laid along the lower electrode,
wherein the additional film is provided at a distance from the lower electrode, a shape of the additional film is the same as an external shape of the lower electrode at the portion at which the lower electrode and the upper electrode face each other and the piezoelectric film is buried between the lower electrode and the additional film.

2. The piezoelectric thin-film resonator as claimed in claim 1, wherein the piezoelectric film covers the additional film.

3. The piezoelectric thin-film resonator as claimed in claim 1, wherein the additional film is made of the same material as the lower electrode.

4. The piezoelectric thin-film resonator as claimed in claim 1, wherein a cavity having a dome-like shape is provided between the substrate and the lower electrode below the portion at which the lower electrode and the upper electrode face each other.

5. The piezoelectric thin-film resonator as claimed in claim 4, wherein the lower electrode has a hole continuing to the cavity.

6. The piezoelectric thin-film resonator as claimed in claim 1, wherein a cavity is formed in the substrate under the portion at which the lower electrode and the upper electrode face each other.

7. The piezoelectric thin-film resonator as claimed in claim 4, wherein the portion at which the lower electrode and the upper electrode face each other is included in a region formed by projecting the cavity onto the substrate.

8. The piezoelectric thin-film resonator as claimed in claim 1, wherein stress on the portion at which the lower electrode and the upper electrode face each other is compressive stress.

9. The piezoelectric thin-film resonator as claimed in claim 1, wherein the portion at which the lower electrode and the upper electrode face each other has an oval shape.

10. The piezoelectric thin-film resonator as claimed in claim 1, wherein the portion at which the lower electrode and the upper electrode face each other has a polygonal shape formed with nonparallel sides.

11. The piezoelectric thin-film resonator as claimed in claim 1 wherein the piezoelectric film is made of aluminum nitride or zinc oxide with an orientation having a principal axis extending in a (002) direction.

12. A filter comprising piezoelectric thin-film resonators including:
   a lower electrode that is formed on a substrate;
   a piezoelectric film that is formed on the substrate and the lower electrode;
   an upper electrode that is formed on the piezoelectric film, with a portion of the piezoelectric film being interposed between the lower electrode and the upper electrode facing each other; and
   an additional film that is formed on the substrate on at least a part of an outer periphery of the lower electrode at the portion at which the lower electrode and the upper electrode face each other, the additional film being laid along the lower electrode,
   wherein the additional film is provided at a distance from the lower electrode, a shape of the additional film is the same as an external shape of the lower electrode at the portion at which the lower electrode and the upper electrode face each other and the piezoelectric film is buried between the lower electrode and the additional film.

13. A piezoelectric thin-film resonator comprising:
   a lower electrode that is formed on a substrate;
   a piezoelectric film that is formed on the substrate and the lower electrode;
   an upper electrode that is formed on the piezoelectric film, with a portion of the piezoelectric film being interposed between the lower electrode and the upper electrode facing each other; and
   an additional film that is formed on the substrate on at least a part of an outer periphery of the lower electrode at the portion at which the lower electrode and the upper electrode face each other, the additional film being laid along the lower electrode,
   wherein the additional film is provided at a distance from the lower electrode and the distance is 2.0 um or less.

* * * * *